United States Patent
Sukegawa

(10) Patent No.: US 7,890,732 B2
(45) Date of Patent: Feb. 15, 2011

(54) MEMORY CARD AND SEMICONDUCTOR DEVICE

(75) Inventor: Hiroshi Sukegawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/945,187

(22) Filed: Nov. 26, 2007

(65) Prior Publication Data

US 2008/0082737 A1    Apr. 3, 2008

Related U.S. Application Data

(63) Continuation of application No. 10/933,222, filed on Sep. 3, 2004.

(30) Foreign Application Priority Data

Feb. 4, 2004    (JP) .............................. 2004-028101

(51) Int. Cl.
G06F 9/26    (2006.01)
G06F 9/34    (2006.01)
(52) U.S. Cl. .................................... 711/206
(58) Field of Classification Search ........................ None
See application file for complete search history.

(56) References Cited

U.S. PATENT DOCUMENTS

| | | | |
|---|---|---|---|
| 5,557,767 A | 9/1996 | Sukegawa | |
| 5,572,466 A | 11/1996 | Sukegawa | |
| 5,603,001 A * | 2/1997 | Sukegawa et al. | ........... 711/103 |
| 5,673,383 A | 9/1997 | Sukegawa | |
| 6,189,081 B1 | 2/2001 | Fujio | |
| 6,378,033 B1 * | 4/2002 | Nishikawa | .................. 711/103 |
| 6,498,750 B2 | 12/2002 | Terada | |
| 6,513,095 B1 | 1/2003 | Tomori | |
| 6,834,322 B2 | 12/2004 | Sukegawa | |
| 6,845,438 B1 | 1/2005 | Tanaka et al. | |
| 6,854,000 B2 | 2/2005 | Ikegami et al. | |
| 6,906,961 B2 | 6/2005 | Eggleston et al. | |
| 7,245,539 B2 | 7/2007 | Oshima | |
| 2003/0135690 A1 * | 7/2003 | Lee et al. | ..................... 711/103 |
| 2003/0137874 A1 * | 7/2003 | Furukawa | .............. 365/185.17 |

(Continued)

FOREIGN PATENT DOCUMENTS

JP    6-119128    4/1994

(Continued)

OTHER PUBLICATIONS

Dufour et al., Advantages of Large Erase Blocks,Sep. 1995,Intel Corporation,8 pages.*

(Continued)

Primary Examiner—Kevin L Ellis
Assistant Examiner—Gary W Cygiel
(74) Attorney, Agent, or Firm—Oblon, Spivak, McClelland, Maier & Neustadt, L.L.P.

(57) ABSTRACT

A memory card includes a controller and a nonvolatile semiconductor memory. The controller manages a correspondence between a first address in a semiconductor memory of a first erase block size and a second address in a semiconductor memory of a second erase block size other than the first erase block size. The nonvolatile semiconductor memory is a memory of the second erase block size. The controller executes access to the nonvolatile semiconductor memory by the second address.

27 Claims, 12 Drawing Sheets

U.S. PATENT DOCUMENTS

2005/0144360 A1* 6/2005 Bennett et al. .............. 711/103
2006/0064537 A1 3/2006 Oshima

FOREIGN PATENT DOCUMENTS

| | | |
|---|---|---|
| JP | 6-289999 | 10/1994 |
| JP | 2001-344148 | 12/2001 |
| JP | 2002-133877 | 5/2002 |
| JP | 2003-122630 | 4/2003 |

OTHER PUBLICATIONS

U.S. Appl. No. 12/034,306, filed Feb. 20, 2008, Kawamoto, et al.

* cited by examiner

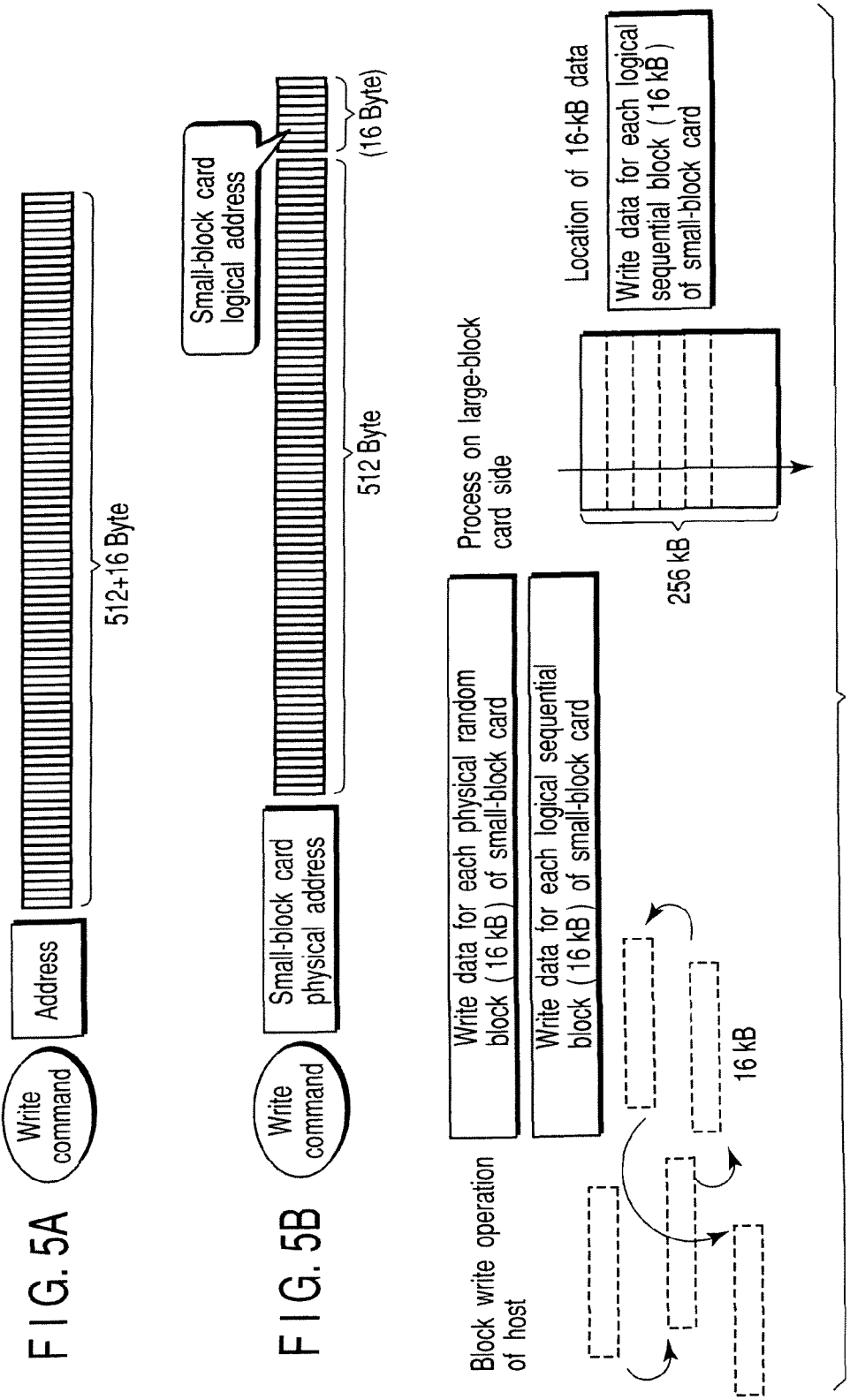

_US 7,890,732 B2_

MEMORY CARD AND SEMICONDUCTOR DEVICE

CROSS-REFERENCE TO RELATED APPLICATIONS

This application is a Continuation of and claims the benefit of priority under 35 U.S.C. §120 from U.S. Ser. No. 10/933,222, filed Sep. 3, 2004, and claims the benefit of priority under 35 U.S.C. §119 from prior Japanese Patent Application No. 2004-028101, filed Feb. 4, 2004. The entire contents of each are incorporated herein by reference.

BACKGROUND OF THE INVENTION

1. Field of the Invention

The present invention relates to a memory card with a nonvolatile semiconductor memory and, more particularly, to a memory card with a NAND flash memory and a semiconductor device embedded in the memory card.

2. Description of the Related Art

Some of different flash memory cards are so configured that a host manages physical conditions in the memory cards (indicating which logical sector address is included in which physical block address or which block is in erase state). In such a memory card, the host directly controls a flash memory of the memory card. The host assumes a write unit and an erase unit of the flash memory and executes write access and erase access to the flash memory using a given block size as an erase unit.

A memory card has recently been noticed in which a block size of erase unit is larger than before.

Jpn. Pat. Appln. KOKAI Publication No. 2002-133877 discloses a technique capable of varying in erase size to partly erase data from a memory cell and shortening a time period for erasing data from a larger area.

If no measures are taken when a flash memory in a memory card to be accessed varies in write unit and erase unit (e.g., the block size of erase unit becomes large), a host cannot execute access to the memory card.

The above problem can be resolved by embedding a conversion controller in the memory card. If, however, the internal conditions of the flash memory are maintained as the host indicates, data needs rewriting in units of erase on the flash memory each time the host executes write access and erase access to the flash memory. A load on the internal operations for write and erase therefore increases considerably. The above publication involves a similar problem.

BRIEF SUMMARY OF THE INVENTION

According to one aspect of the present invention, there is provided a semiconductor device comprising a memory which stores a program to manage a correspondence between a first address in a semiconductor memory of a first erase block size and a second address in a semiconductor memory of a second erase block size other than the first erase block size; and a processor which executes the program stored in the memory.

According to another aspect of the present invention, there is provided a memory card comprising a controller which manages a correspondence between a first address in a semiconductor memory of a first erase block size and a second address in a semiconductor memory of a second erase block size other than the first erase block size; and a nonvolatile semiconductor memory of the second erase block size, the controller executing access to the nonvolatile semiconductor memory by the second address.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIGS. 5A and 5B are diagrams of formats of commands transmitted from the host;

FIG. 6 is a diagram comparing a block write operation assumed by the host and a write operation performed in actuality by the memory card (large-block card);

DETAILED DESCRIPTION OF THE INVENTION

Embodiments of the present invention will be described below with reference to the drawings.

Figure 1:
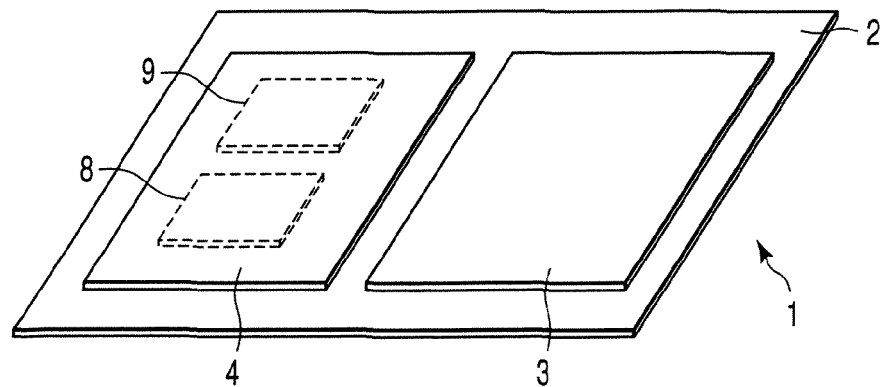
FIG. 1 is a schematic perspective view of arrangement of devices embedded in a memory card according to an embodiment of the present invention.

FIG. 1 is a perspective view of arrangement of devices embedded in a memory card according to an embodiment of the present invention.

A memory card 1 includes a PCB (printed circuit board) substrate 2 on which a NAND flash memory 3 and a controller 4 are arranged as shown in FIG. 1. The controller 4 has functional blocks such as a CPU (central processing unit) 8 and a ROM (read-only memory) 9. The respective devices will be described in detail later. The NAND flash memory 3 may include a binary memory that stores information of one bit in one memory cell. The NAND flash memory 3 may include a multilevel memory that stores information of more than one bit (e.g., two bits) in one memory cell. The NAND flash memory 3 and controller 4 can be arranged on the same LSI (large-scale integration) substrate.

Terms "logical block address" and "physical block address" used in the following descriptions mean a logical address of a block in itself and a physical address thereof, respectively. Terms "logical address" and "physical address" also chiefly mean a logical address of a block in itself and a physical address thereof, respectively, but they can mean an address corresponding to the unit of resolution that is smaller than that of block.

Figure 2:
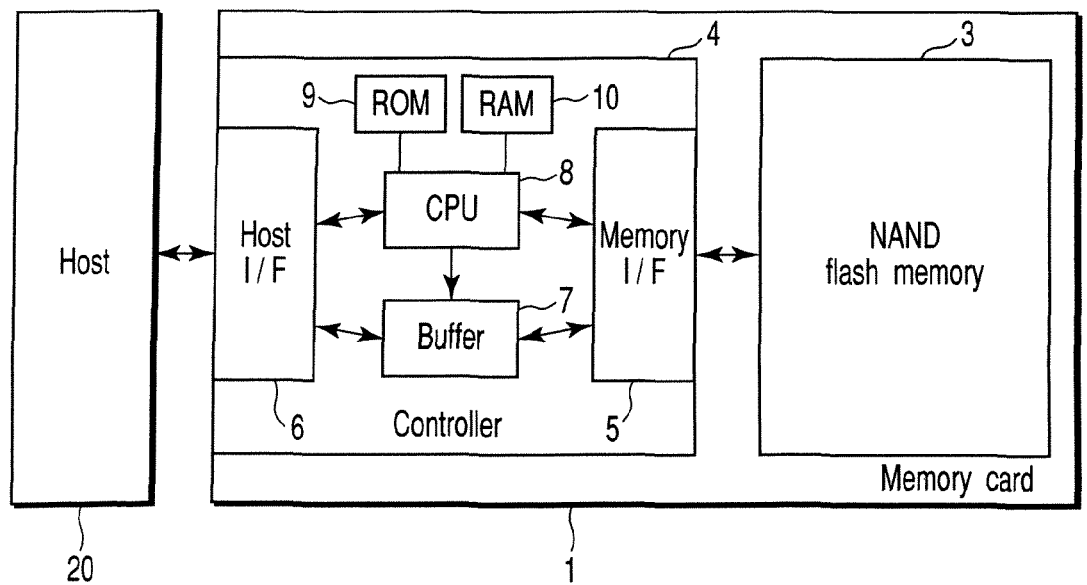
FIG. 2 is a block diagram of a configuration including a host and the memory card according to an embodiment of the present invention.

FIG. 2 is a block diagram of a configuration including a host device and the above memory card. The same elements as those in FIG. 1 are denoted by the same reference numerals.

A host device (hereinafter referred to as a host) 20 includes hardware and software (system) for executing access to the memory card connected thereto. The host 20 manages physical conditions in the memory card (indicating which logical sector address is included in which physical block address or which block is in erase state). The host 20 directly controls the flash memory in the memory card.

The host 20 assigns a logical/physical address to the flash memory in units of 16 Kbytes on the assumption that a NAND flash memory having an erase block size of 16 Kbytes is used. In most cases, the host 20 executes write access or read access in sequence for the logical address of 16 Kbytes (i.e., issues a corresponding command).

The memory card 1 receives power and operates when it is connected to the host 20, and performs a process corresponding to access from the host 20. The memory card 1 includes a NAND flash memory 3 and a controller 4 as described above.

The NAND flash memory 3 is a nonvolatile semiconductor memory whose erase block size (block size of erase unit) is 256 Kbytes. For example, data is written to or read out of the memory 3 in units of 16 Kbytes. The NAND flash memory 3 is fabricated using, e.g., a 0.09 µm process. In other words, the design rule of the NAND flash memory 3 is smaller than 0.1 µm.

The controller 4 includes a memory interface 5, a host interface 6, a buffer 7 and a RAM (random access memory) 10 as well as the CPU 8 and ROM 9 described above.

The memory interface 5 performs an interface process between the controller 4 and NAND flash memory 3. The host interface 6 performs an interface process between the controller 4 and host 20.

When the buffer 7 writes data, which is sent from the host 20, to the NAND flash memory 3, it temporarily stores a given amount of data (e.g., data for one page). When the buffer 7 sends data, which is read out of the memory 3, to the host 20, it temporarily stores a given amount of data.

The CPU 8 controls the entire operation of the memory card 1. When the memory card 1 receives power, the CPU 8 loads firmware (control programs described later), which is stored in the ROM 9, onto the RAM 10 to perform a given process. The CPU 8 thus creates different tables (described later) on the RAM 10, receives a write command, a read command and an erase command from the host 20 and executes access to their corresponding areas on the NAND flash memory 3, and controls the transfer of data through the buffer 7.

The ROM 9 is a memory that stores control programs and the like used by the CPU 8. The RAM 10 is a memory that is used as an operation area of the CPU 8 to store control programs and different tables.

Figure 3:
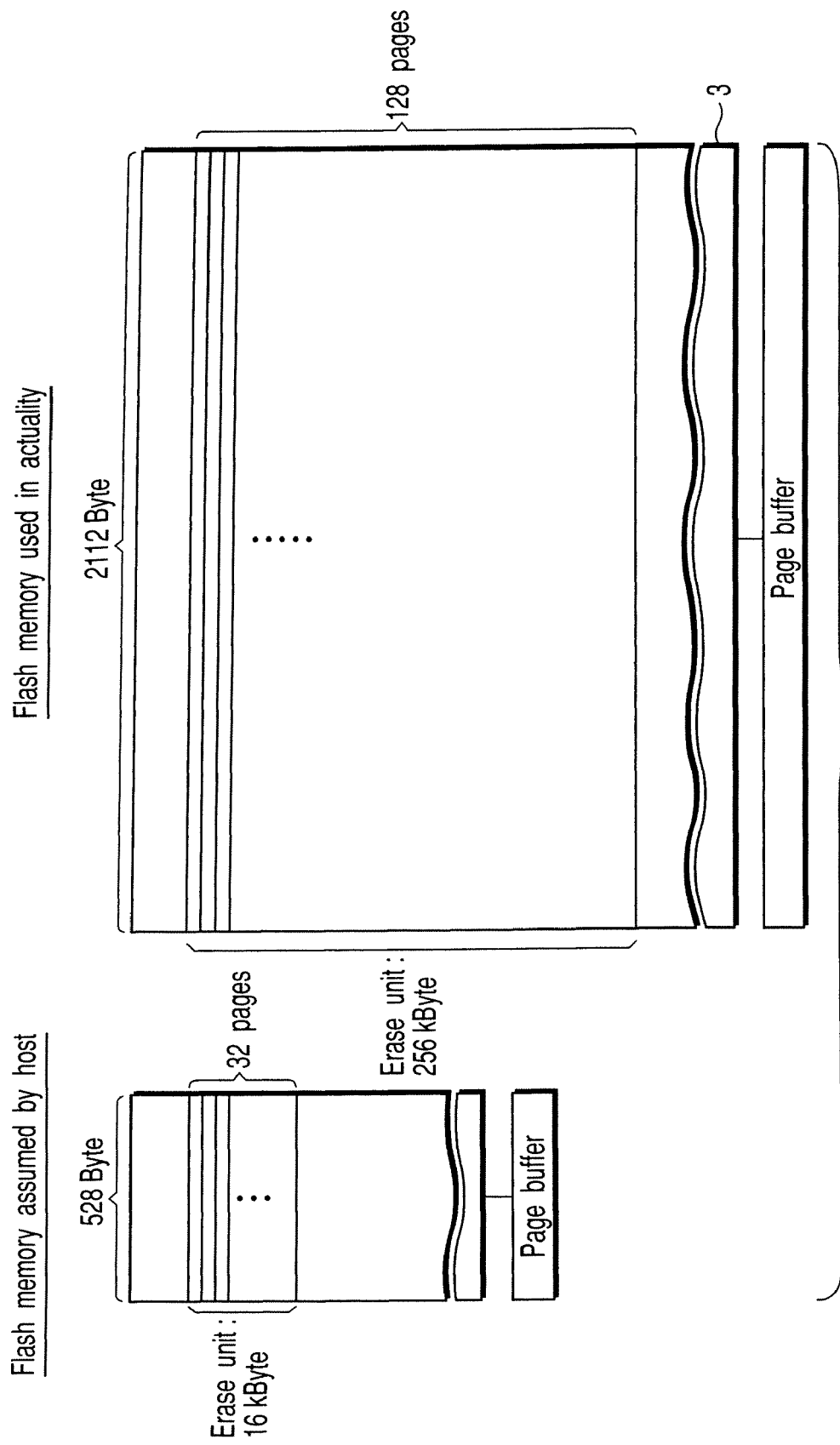
FIG. 3 is a diagram showing a difference in data location between a flash memory assumed by the host and a flash memory used in actuality.

FIG. 3 shows a difference in data location between a flash memory assumed by the host 20 and a flash memory used in actuality (i.e., the NAND flash memory 3 in the memory card 1).

In the flash memory assumed by the host 20, each page has 528 bytes (512-byte data storage area+16-byte redundant area), and 32 pages correspond to one erase unit (16 Kbytes+0.5 Kbytes where K is 1024). Hereinafter a card with such a flash memory is sometimes referred to as a "small-block card."

In the flash memory 3 used in actuality, each page has 2112 bytes (512-byte data storage area×4+10-byte redundant area× 4+24-byte management data storage area), and 128 pages correspond to one erase unit (256 Kbytes+8 Kbytes). Hereinafter a card with such a flash memory is sometimes referred to as a "large-block card." For the sake of convenience, the erase unit of the small-block card is considered to be 16 Kbytes and that of the large-block card is considered to be 256 Kbytes.

The flash memory assumed by the host 20 and the flash memory 3 used in actuality each have a page buffer to input/output data to/from the flash memory. The storage capacity of the page buffer of the flash memory assumed by the host 20 is 528 bytes (512 bytes+16 bytes), and that of the page buffer of the flash memory 3 used in actuality is 2112 bytes (2048 bytes+64 bytes). For example, in data write mode, each page buffer inputs/outputs data to/from the flash memory for each page corresponding to its own storage capacity.

In FIG. 3, the erase block size of the flash memory 3 used in actuality is sixteen times as large as that of the flash memory assumed by the host 20. The present invention is not limited to this magnification. These sizes can be changed if the former is substantially an integral multiple of the latter.

It is desirable that the storage capacity of the flash memory 3 shown in FIG. 3 be 1 gigabit or more in order to put the large-block card to practical use. When the storage capacity of the flash memory 3 is, for example, 1 gigabit, the number of 256-Kbyte blocks (erase unit) is 512.

In FIG. 3, the erase unit is a 256-Kbyte block. As a matter of practicality, it is effective to set the erase unit to a 128-Kbyte block and, in this case, the number of 128-Kbyte blocks is 1024.

In FIG. 3, the erase block size of the flash memory 3 used in actuality is larger than that of the flash memory assumed by the host 20. However, the present invention is not limited to this case. The erase block size of the flash memory 3 used in actuality can be smaller than that of the flash memory assumed by the host 20.

Figure 4:
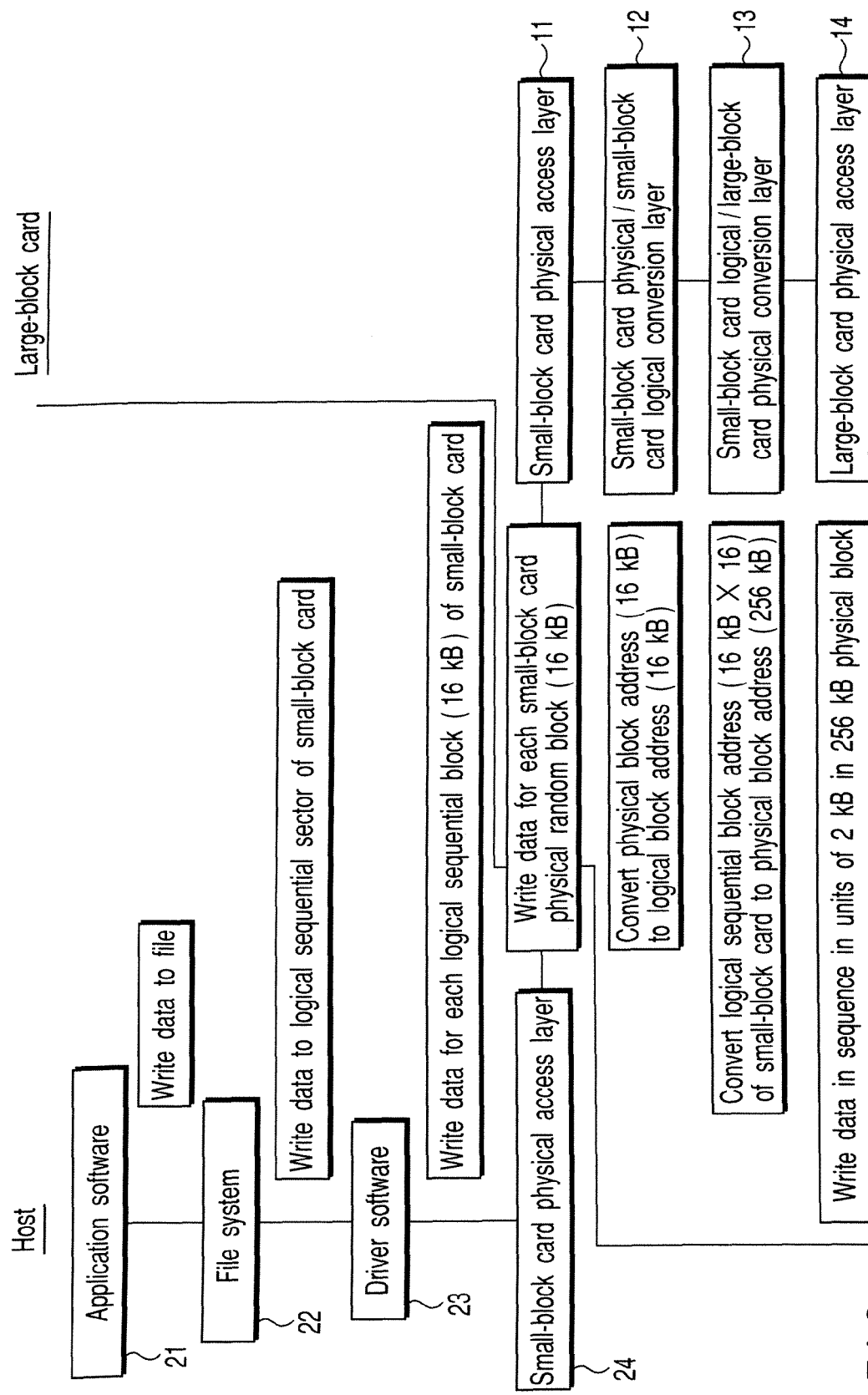
FIG. 4 is a chart showing a communication hierarchy of the host and the memory card (large-block card)

FIG. 4 shows a communication hierarchy of a system of the host 20 and the memory card 1 (large-block card).

The host 20 includes application software 21, a file system 22, driver software 23 and a small-block card physical access layer 24. The memory card 1 (large-block card) includes a small-block card physical access layer 11, a small-block card physical/small-block card logical conversion layer 12, a small-block card logical/large-block card physical conversion layer 13 and a large-block card physical access layer 14.

If the application software 21 requests the file system 22 to write data to a file, the file system 22 instructs the driver software 23 to write data in sequence to a sector based on the logical block address of the small-block card. In order to perform a sequential write operation for each 16-Kbyte block based on the logical block address of the small-block card, the driver software 23 makes logical/physical block conversions to issue a random write command, which indicates the physical block address of the small-block card, to the large-block card through the small-block card physical access layer 24 and to transfer data.

In write access, both the small-block card and large-block card are predicated on that information is transferred in the following order in terms of a protocol: (1) command, (2) page address (row address), (3) column address, (4) data and (5) program confirmation command.

Upon receiving a write command, which indicates the physical block address of the small-block card, from the host 20, the small-block card physical access layer 11 acquires not only the physical block address and data but also a logical block address contained in data accompanying the physical block address and data.

The small-block card physical/small-block card logical conversion layer 12 has a first table for converting a physical block address (for a 16-Kbyte block) of the small-block card to a logical block address (for a 16-Kbyte block) of the small-block card in data read mode. When the physical access layer 11 acquires the logical block address of the small-block card in response to the write command, the conversion layer 12 reflects it in the first table. The conversion layer 12 also reflects the physical block address in the first table.

The small-block card logical/large-block card physical conversion layer 13 has a second table for converting a logical block address (for sequential 16-Kbyte blocks×16) of the small-block card to a physical block address (for 256-Kbyte physical blocks) of the large-block card in data read mode. When the physical access layer 11 receives a write command and acquires the logical block address of the small-block card, the conversion layer 12 reflects it in the second table.

The large-block card physical access layer 14 determines a data location in the flash memory 3 based on the logical block address of the small-block card acquired by the small-block card physical access layer 11, and writes 16-Kbyte data in sequence in units of two Kbytes (for each page) in the 256-Kbyte physical block. The layer 14 stores the logical block address and physical block address of the small-block card in a given area within a management data area in the flash memory 3.

Since the host 20 issues a command based on the physical block address of the small-block card, the large-block card manages to see which 256-Kbyte physical block contains the data corresponding to the physical block address of the small-block card. More specifically, the host 20 manages a correspondence between the logical and physical block addresses of the small-block card for each 16-Kbyte block and manages to see which 256-Kbyte physical block in the large-block card contains the data corresponding to logical block addresses for sequential 256-Kbyte blocks of the small-block card.

The host 20 assumes that the erase unit is a 16-Kbyte block but actually executes access to the large-block card whose erase unit is a 256-Kbyte physical block. The large-block card flexibly responds to the access in conformity with the control algorithm and physical format used by the host 20. In view of the control algorithm that when a new write operation is performed by a 16-Kbyte logical block address, data of a block (hereinafter referred to an old assign logical block) corresponding to a 16-Kbyte physical block address of the small-block card, which has already been written by the same logical block address, is erased, the host 20 emulates that the old assign logical block is in erase state. In actuality, however, data for a 16-Kbyte block is not erased in the large-block card; accordingly, overhead costs of physical operations for the flash memory 3 can greatly be reduced.

FIGS. 5A and 5B are diagrams of formats of commands transmitted from the host 20.

The packet of formats of commands sent from the host 20 contains different types of information such as command type information (in this case, "write" information), an address (physical block address) and data (actual content data and accompanying data (512 Bytes+16 Bytes)), as shown in FIG. 5A.

In the above packet, a logical block address of the small-block card (i.e., a logical address corresponding to a 16-Byte block to be accessed) is located in a given position in the accompanying data of 16 Bytes. The large-block card acquires, in particular, the logical block address described above as well as the command type information, physical block address and data.

FIG. 6 is a diagram comparing a block write operation assumed by the host 20 and a write operation performed in actuality by the memory card 1 (large-block card).

When a sequential write operation is performed for each 16-Kbyte block based on the logical address of the small-block card, the host 20 (on the left side of FIG. 6) performs a random write operation in units of 16-Kbyte blocks based on the physical block address of the small-block card. This is based on the premise that data is erased from the old assign logical block for each 16-Kbyte block.

Upon receiving a write command from the host 20, the large-block card (on the right side of FIG. 6) writes data in sequence to the flash memory 3 for each 16-Kbyte block based on the logical block address of the small-block card. In accordance with the above premise, the large-block card notifies the host 20 that the old assign logical block in the small block card is also in erase state. If the host 20 executes read access to the old assign logical block, the large-block card responds to the access, notifying the host 20 that the block is in erase state. The large-block card also notifies, as needed, the host 20 that a physical block of the small-block card, which is not assigned to the logical block address of the small-block card, is in erase state.

As described above, the host 20 performs a random write operation in units of 16 Bytes based on the physical address of the small-block card. The random write operation generally causes frequent operations for rewriting data of only part of a large block card (256 Kbytes). In the NAND flash memory, data cannot be erased only for each block. In order to rewrite data of only part of a block, there is a need to write new data to a new block whose data has been erased, and copy the other data not to be rewritten, from an old block to the new block. The operation of rewriting data of only part of a block accompanies an operation of copying data not to be rewritten (hereinafter referred to as "involved data copy"). If the rewriting operation is frequently carried out, overhead costs greatly increase.

In the present embodiment, a physical address is reassigned on the large-block card in order of the logical address obtained from the host 20. This reassignment decreases the number of operations of rewriting data of only part of a block and prevents overhead costs from increasing.

Figure 7A:
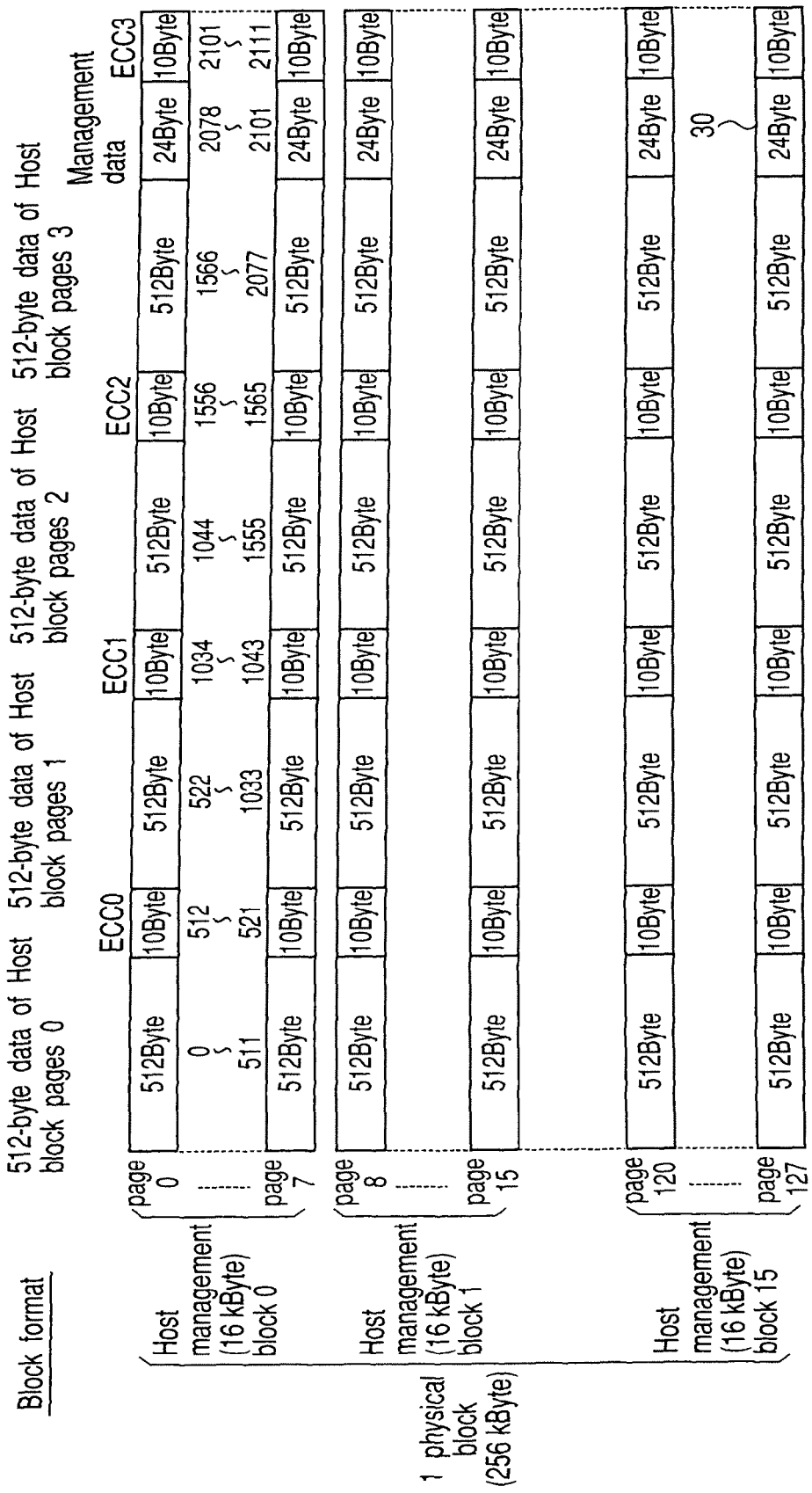
FIGS. 7A and 7B are a diagram showing a block format (for 256-Kbyte physical block that is an erase unit) of the flash memory in the large block card and a diagram showing details of a last 24-Byte management data area.
Figure 7B:
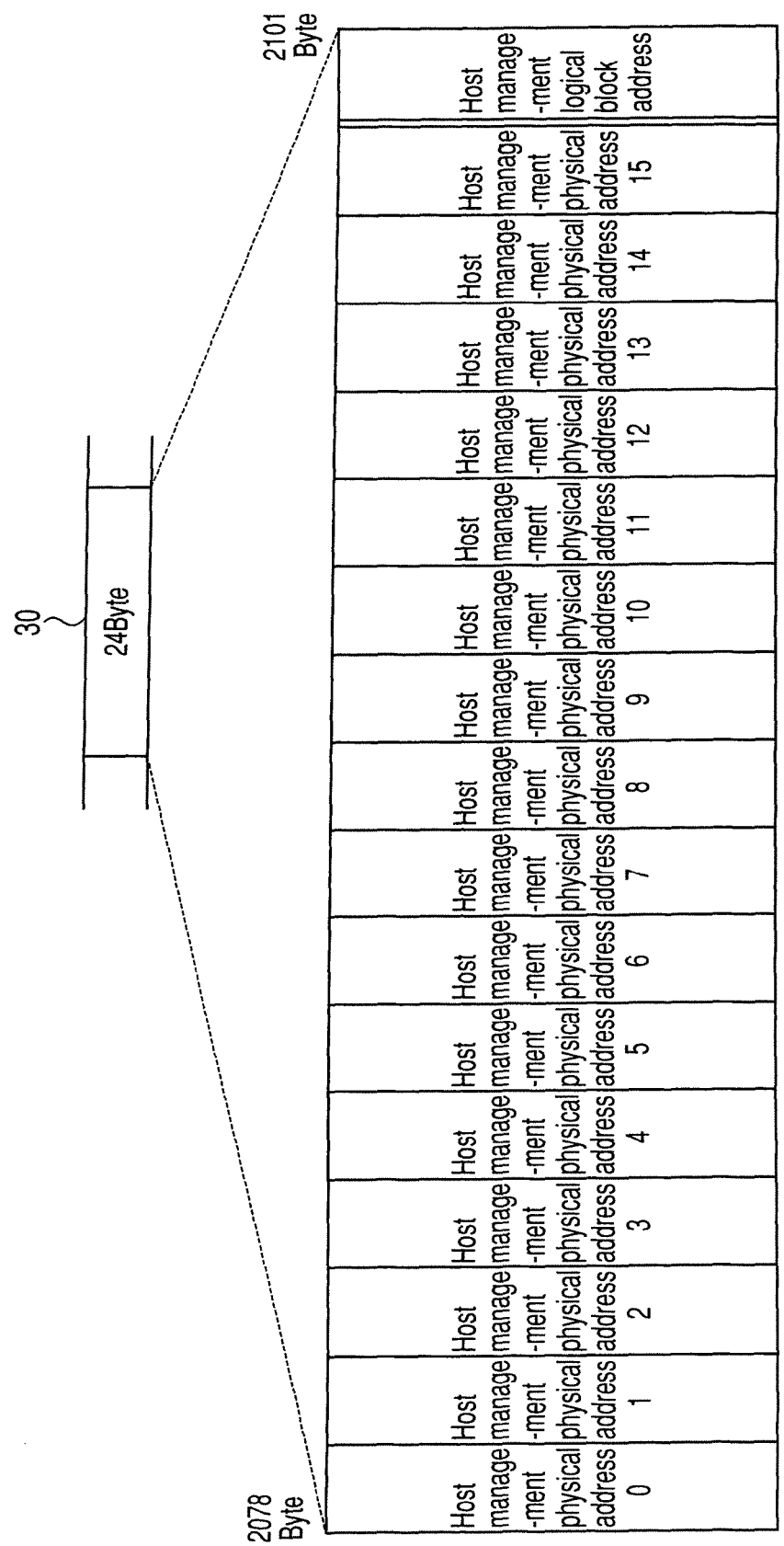

FIGS. 7A and 7B are a diagram showing a block format (for a 256-Kbyte physical block that is an erase unit) of the NAND flash memory 3 in the large-block card and a diagram showing details of a last 24-Byte management data area.

In the large-block card, the 256-Kbyte physical block includes sixteen blocks (hereinafter referred to as host management blocks) for writing 16-Kbyte data that is a unit managed by the host 20. In data write mode, data items are located in order of the logical block address of the small-block card.

Each of the host management blocks is made up of eight pages. Each of the pages includes four 512-Byte data areas and their corresponding 10-Byte ECC areas. Each of the pages also includes a 24-Byte management data area after the last 512-Byte data area (fourth 512-Byte data area). The last 10-Byte ECC area is therefore applied to both the fourth 512-Byte data area and the 24-Byte management data area.

Of 128 24-Byte management data areas included in the 256-Kbyte physical block, the last 24-Byte management data area 30 stores both address information corresponding to the physical block address acquired by a command send from the host 20 (hereinafter referred to as a host management physical address) and address information corresponding to the logical block address (hereinafter referred to as a host management logical block address) together.

More specifically, whenever 16-Kbyte data is written to a 16-Kbyte host management block, its corresponding host management physical address (for, e.g., 10 bits) is stored in a given area in the management data area 30. Thus, sixteen host management physical addresses corresponding to the sixteen 16-Kbyte host management blocks are stored in a given area in the management data area 30. Of sequential sixteen logical bock addresses corresponding to the sixteen 16-Kbyte host management blocks, the initial logical block address (for, e.g., 10 bits) is stored in a given area in the management data area 30 as the host management logical address.

In the above configuration, the CPU 8 reads out information of the final area (512 Bytes+24 Bytes+10 Bytes) in each 256 k-byte and refers to the 24-Byte management data therein to acquire a host management physical address and a host management logical block address of sixteen blocks corresponding to the 256 k-byte block.

The host management physical address and host management logical block address stored in each 256-Kbyte block are used when the first table and the second table shown in FIG. 4 are created.

Figure 8:
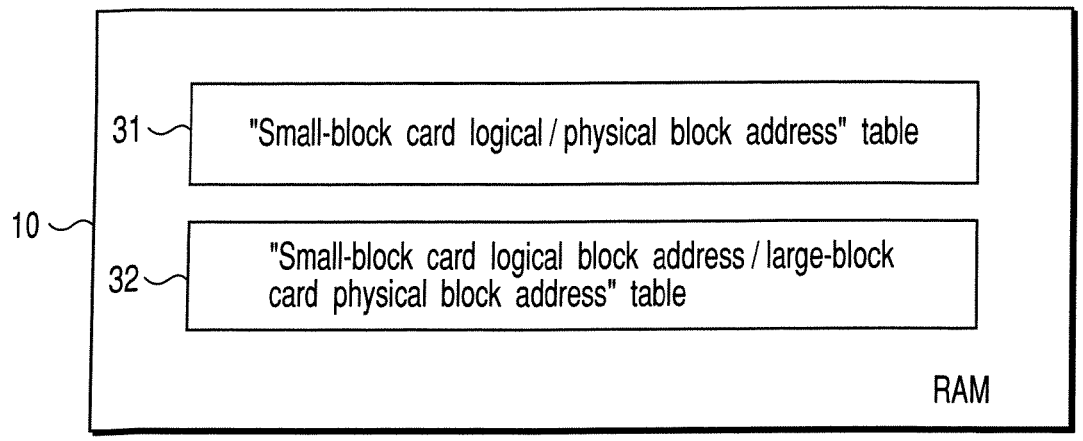
FIG. 8 is a diagram of different tables created on a RAM in a controller.

FIG. 8 is a diagram of different tables created on the RAM 10 in the controller 4.

The first table corresponds to a "small-block card logical/physical block address" table 31 and the second table corresponds to a "small-block card logical block address/large-block card physical block address" table 32. The tables 31 and 32 are created on the RAM 10 using the host management physical address and host management logical block address stored in the data management area 30 (FIGS. 7A and 7B).

The table 31 is used to convert the physical block address (corresponding to 16-Kbyte block) of the small-block card to the logical block address (corresponding to a 16-Kbyte block) of the small-block card in data read mode.

The table 32 is used to convert the logical block address (sequential 16-Kbyte blocks×16) of the small-block card into the physical block address (corresponding to a 256-Kbyte physical block) of the large-block card in data read mode.

Figure 9:
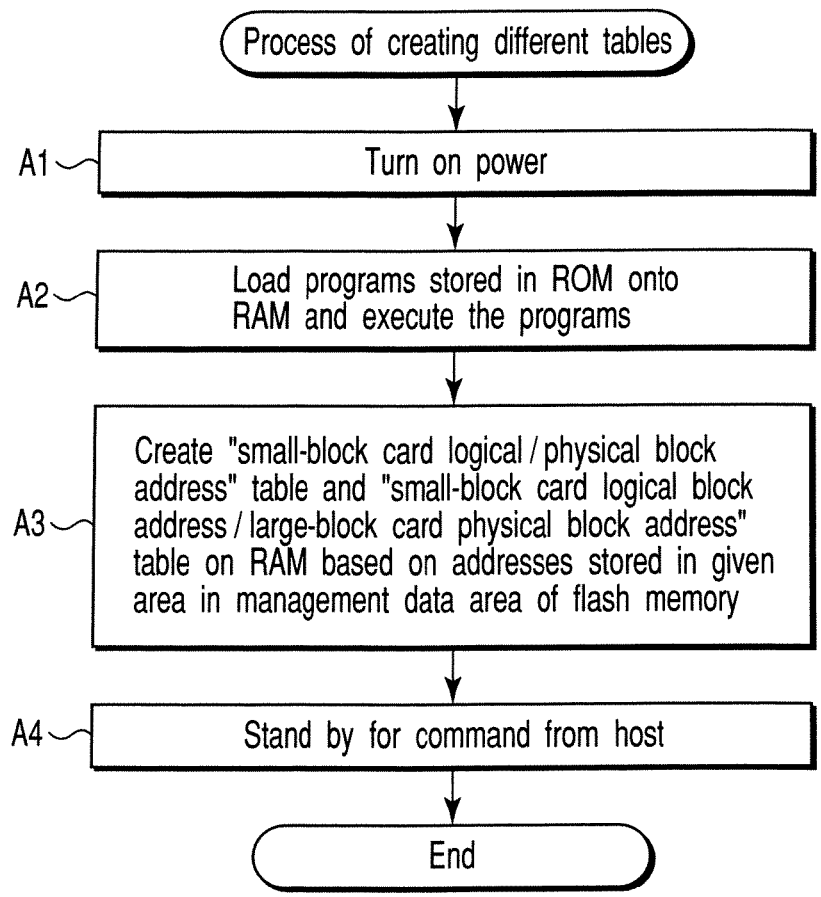
FIG. 9 is a flowchart of a process of creating each of the tables.

A process of creating the tables will now be described with reference to the flowchart shown in FIG. 9.

Upon receiving power from the host 20 (step A1), the memory card 1 (large-block card) starts to operate the CPU 8, and loads a control program (for managing a correspondence between the physical/logical block address of the small-block card and the physical block address of the flash memory 3) stored in the ROM 9 onto the RAM 10 and executes the program (step A2).

The CPU 8 creates a "small-block card logical/physical block address" table 31 and a "small-block card logical block address/large-block card physical block address" table 32 on the RAM 10 using the host management address and host management logical block address stored in the management data area 30 of the flash memory 3 (step A3). Then, the CPU 8 stands by for a command from the host 20 (step A4) and performs an operation for each of write access, read access and erase access in accordance with a control program.

Figure 10:
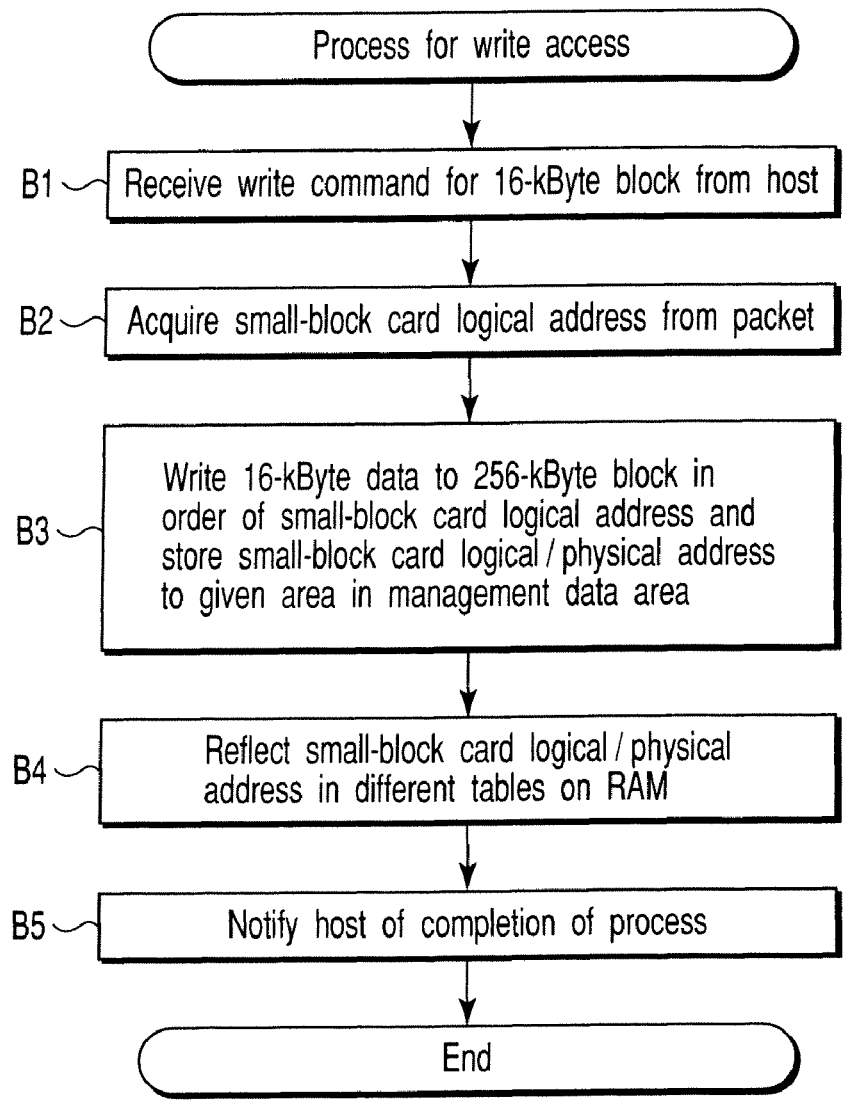
FIG. 10 is a flowchart of a process for write access.

A process of write access will now be described with reference to the flowchart shown in FIG. 10.

Upon receiving a write command for, e.g., a 16-Kbyte block from the host 20 (step B1), the CPU 8 acquires not only a physical block address and data of the small-block card but also a logical block address contained in data accompanying the physical block address and data (step B2).

The CPU 8 writes 16-Kbyte data to a 256-Kbyte physical block in order of the logical block address of the acquired small-block card, and stores the host management logical block address and host management physical address corresponding to the logical block address and physical block address of the small-block card in a give area in the management data area 30 (step B3). The CPU 8 reflects the logical block address and physical block address of the acquired small-block card in the tables 31 and 32 on the RAM 10 (step B4).

Finally, the CPU 8 notifies the host of the completion of the write operation (step B5).

The data write operation in step B3 shown in FIG. 10 will be described in detail with reference to the flowchart shown in FIG. 11 and the conceptual diagrams shown in FIGS. 12 to 15.

Figure 12:
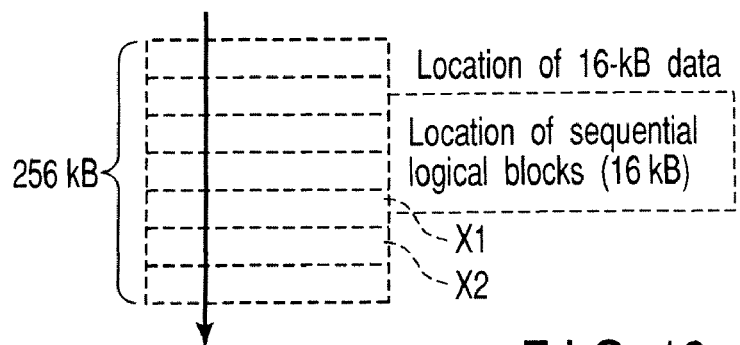
FIG. 12 is a schematic diagram of a process in step C1 of the flowchart shown in FIG. 11.
Figure 11:
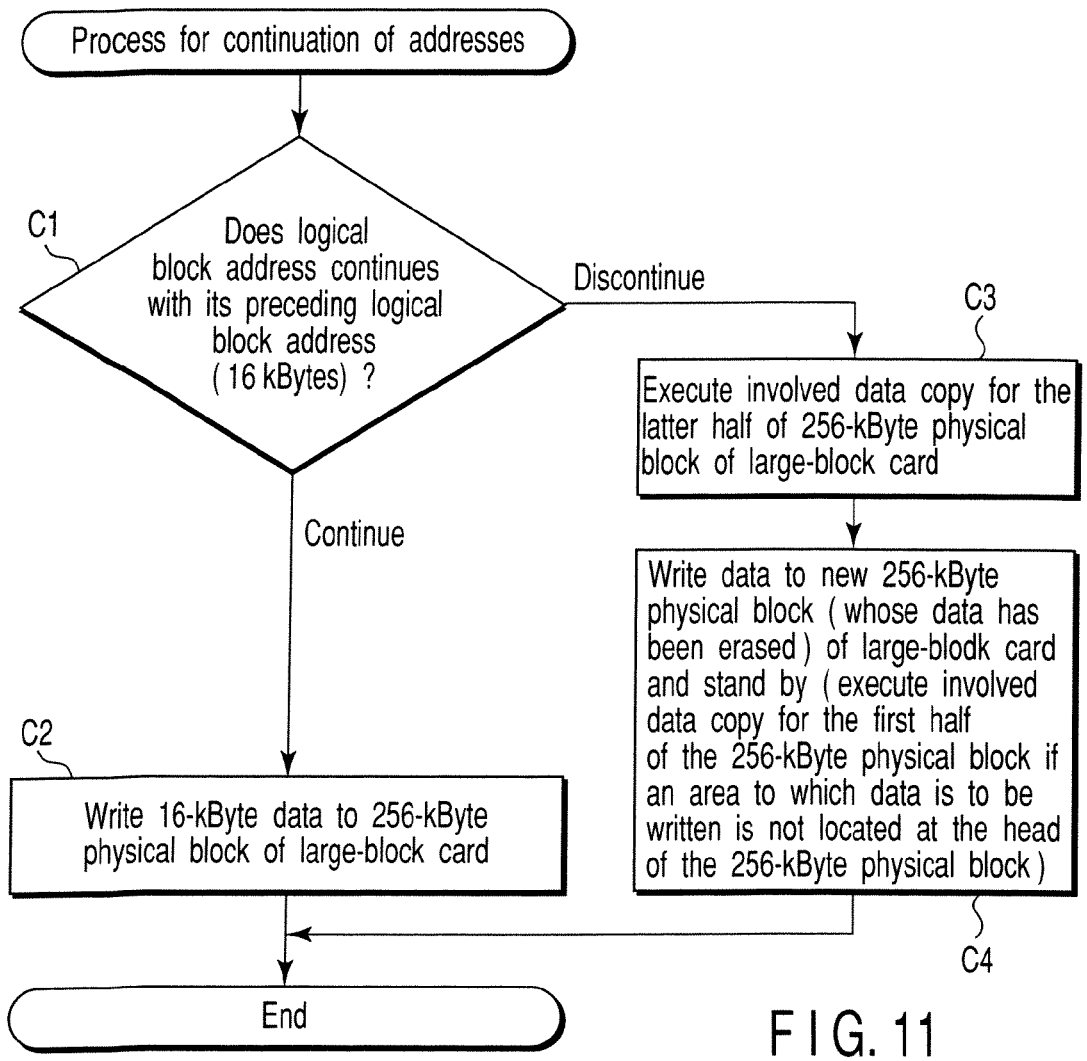
FIG. 11 is a flowchart showing in detail a process for data write in step B3 of the flowchart shown in FIG. 10.

The CPU 8 determines whether a target logical block address (corresponding to a 16-Kbyte block) continues with its preceding logical block address (corresponding to a 16-Kbyte block) in data write mode (step C1 in FIG. 11). In other words, as shown in FIG. 12, when data has been written to the physical block X1 and its previous physical blocks, the CPU 8 determines whether a physical block to which data is to be written next corresponds to a 16-Kbyte physical block X2 continuing with the above physical block X1.

Figure 13:
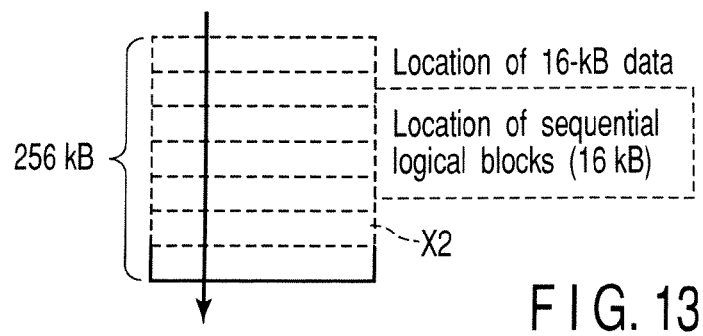
FIG. 13 is a schematic diagram of a process in step C2 of the flowchart shown in FIG. 11.

If the physical block corresponds to the 16-Kbyte physical block X2, the CPU 8 writes 16-Kbyte data to a 256-Kbyte physical block of the large-block card after the previously written 16-Kbyte data (step C2 in FIG. 11). In other words, the CPU 8 writes data to the 16-Kbyte physical block X2 as shown in FIG. 13.

Figure 14:
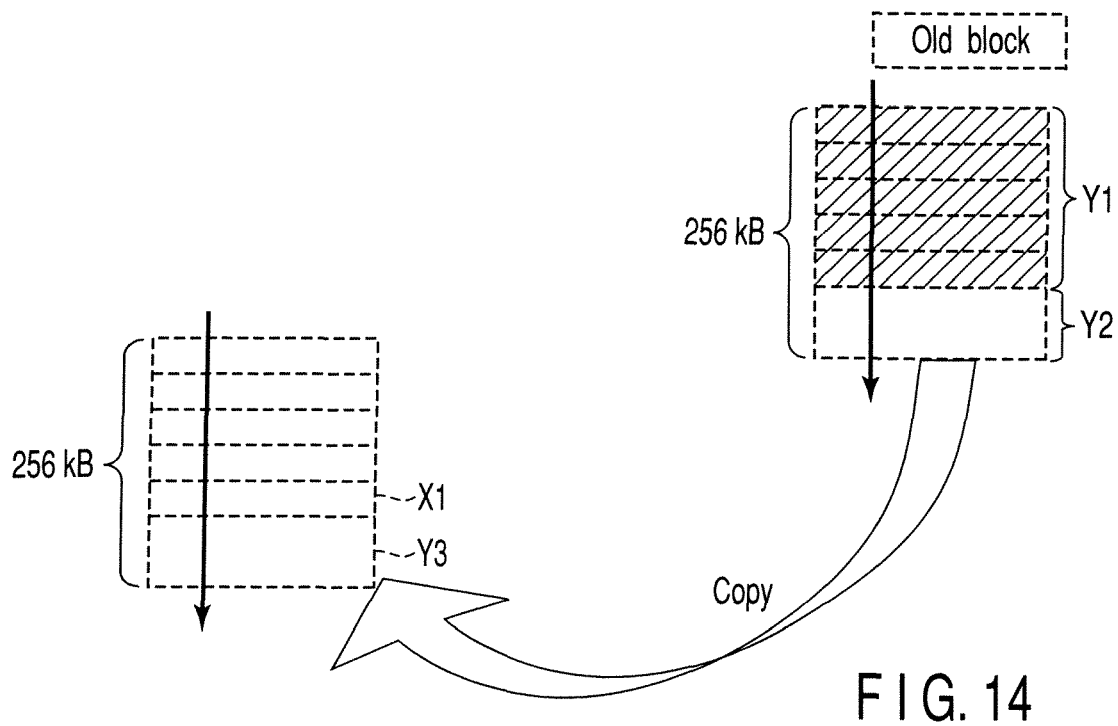
FIG. 14 is a schematic diagram of a process in step C3 of the flowchart shown in FIG. 11.

If the physical block does not correspond to the 16-Kbyte physical block X2, the CPU 8 executes involved data copy for the latter half of the 256-Kbyte physical block of the large-block card (C3 in FIG. 11). In other words, as shown in FIG. 14, the old 256-Kbyte block corresponding to a target 256-Kbyte physical block includes both i) a physical area Y1 of an old assign 16-Kbyte logical block group having old data that is made unnecessary by writing (updating) data to the physical block X1 and its previous physical blocks and ii) a physical area Y2 having effective data that remains effective because no data is updated. Thus, the CPU 8 copies data of the physical area Y2 to a physical area Y3 subsequent to the physical block X1 in the target 256-Kbyte physical block. After the copy, the CPU 8 erases data from the old 256-Kbyte physical block that is made unnecessary.

Figure 15A:
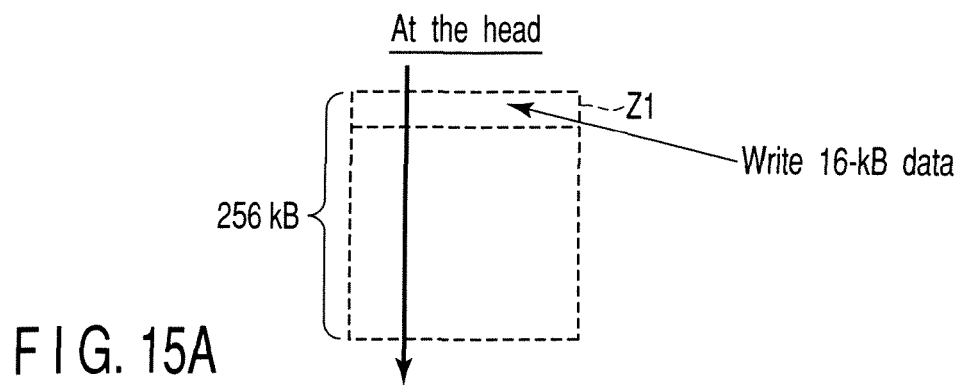
FIGS. 15A and 15B are schematic diagrams of a process in step C4 of the flowchart shown in FIG. 11.
Figure 15B:
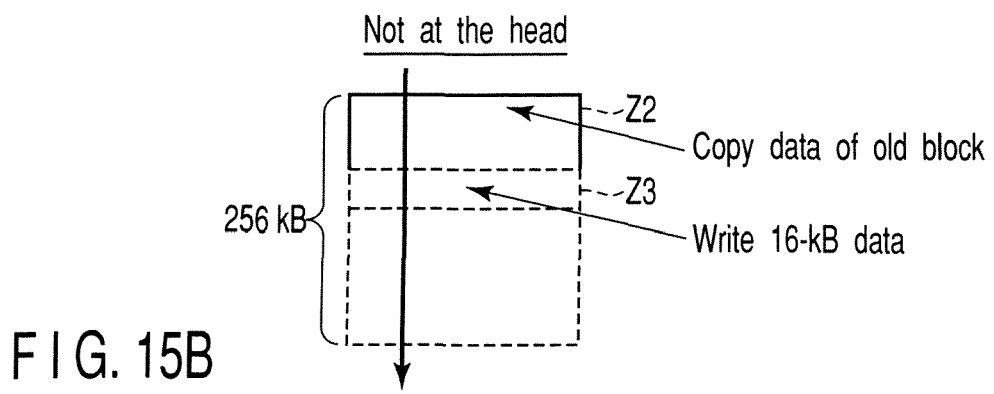

Then, the CPU 8 writes data to a new 256-Kbyte physical block (whose data has been erased) of the large-block card and stands by (step C4). The process varies according to whether an area to which data is to be written is the head of the 256-Kbyte physical block. If the area is the head of the block, the CPU 8 writes 16-Kbyte data to a physical block Z1 located at the head as shown in FIG. 15A. If not, the CPU 8 executes involved data copy for the first half of the 256-Kbyte physical block of the large-block card. In other words, as shown in FIG. 15B, the CPU 8 copies data of the old assign 16-Kbyte logical block group to a physical area Z2 from the head of the 256-Kbyte physical block to a position located immediately before a physical area Z3. After that, the 16-Kbyte data is written to the physical area Z3.

Figure 16:
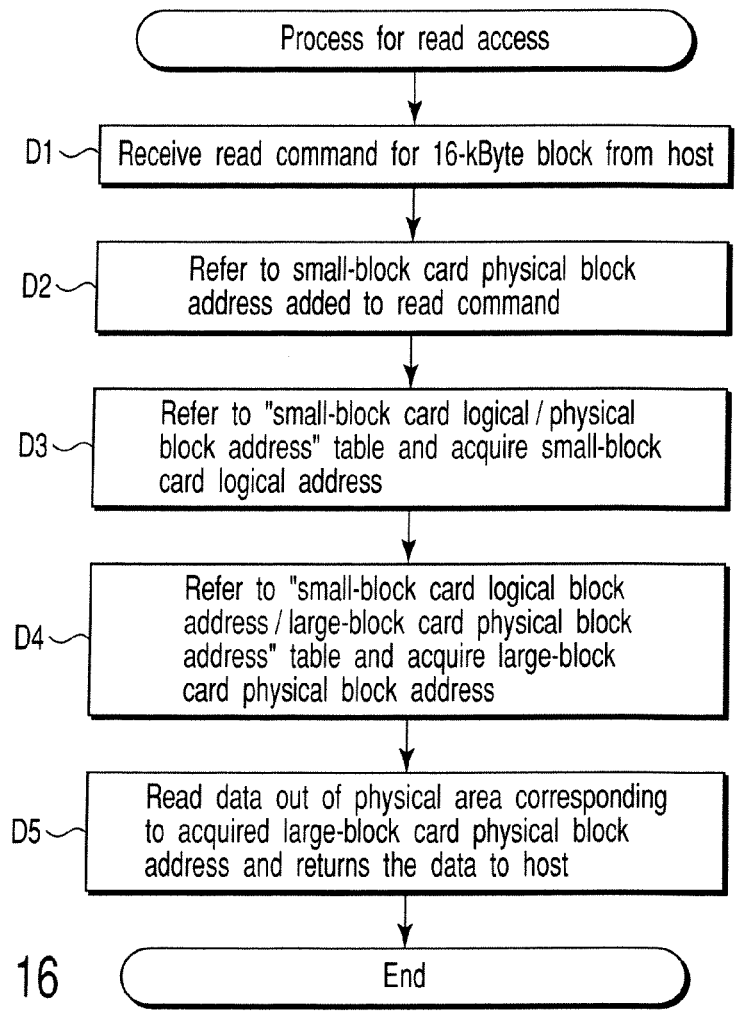
FIG. 16 is a flowchart of a process of read access.

A process of read access will now be described with reference to the flowchart of FIG. 16.

Upon receiving a read command for, e.g., a 16-Kbyte block from the host 20 (step D1), the CPU 8 acquires a physical block address of the small-block card added to the read command (step D2).

Then, the CPU 8 refers to the table 31 and acquires a logical block address of the small-block card from the acquired physical block address (step D3). The CPU 8 refers to the table 32 and acquires a physical block address of the large-block card from the acquired logical block address (step D4).

Finally, the CPU 8 reads data out of a physical area corresponding to the acquired physical block address of the large-block card and returns it to the host 20 (step D5).

Figure 17:
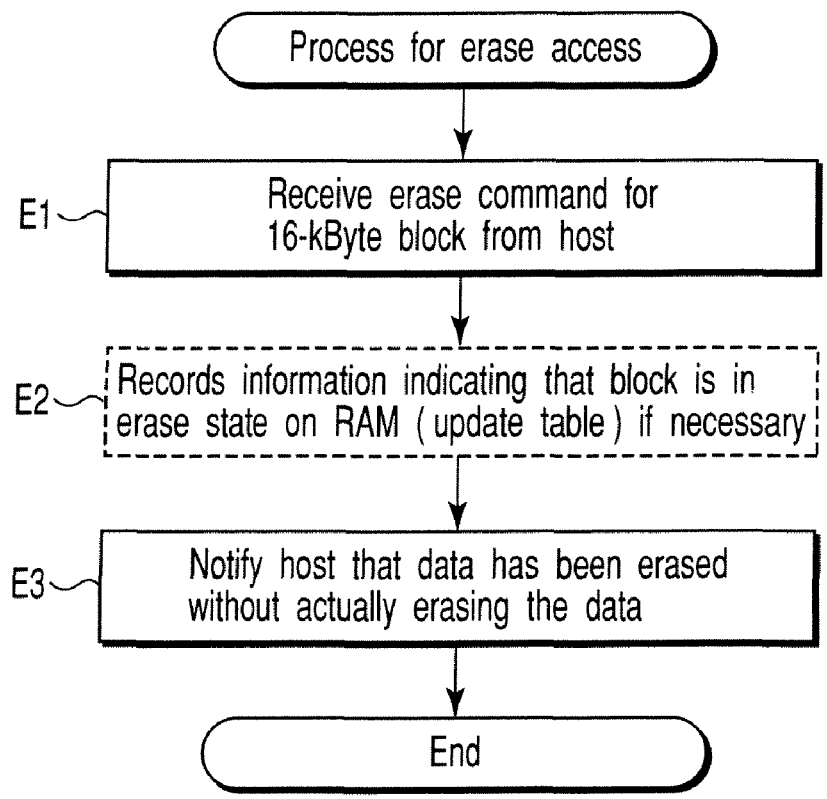
FIG. 17 is a flowchart of a process of erase access.

A process of erase access will now be described with reference to the flowchart of FIG. 17.

Upon receiving an erase command for, e.g., a 16-Kbyte block from the host 20 (step E1), the CPU 8 records information indicating that the block is in erase state in a given area on the RAM 10 when the need arises (step E2).

The step E2 can be omitted. If the CPU 8 executes the step E2, it can correctly reply to a request to confirm an erase state, which is issued from the host 20 when the power turns on or off.

Finally, the CPU 8 does actually not erase data from the block but notifies the host 20 that the data has been erased (step E3).

Figure 18:
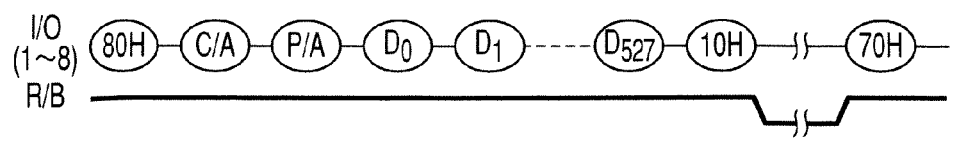
FIG. 18 is a timing chart of signals of I/O and R/B pins of the memory card when the host writes data to the memory card according to the embodiment of the present invention.

FIG. 18 is a timing chart of signals of I/O and R/B pins of the memory card 1 when the host 20 writes data to the memory card 1 according to the embodiment of the present invention.

The host 20 controls the memory card on the premise that the memory card is a nonvolatile memory having an erase block size of 16 Kbytes. For example, when the host 20 writes data to the memory card, the host 20 sends a serial data input command 80H (H indicates a hexadecimal) to I/O pins 1 to 8. Then, the host 20 sends a column address C/A and a page address P/A to the I/O pins 1 to 8. The column address C/A and page address P/A are a column address and a page address in virtual physical address space that the host 20 assumes for the memory card 1.

The host 20 also sends write data to each of the I/O pins 1 to 8 528 times. More specifically, the host 20 sequentially shifts in 528-bit data to each of the I/O pins (528 bytes in total for all the I/O pins) while clocking signals input to a write enable pin 528 times. Completing the shift-in of data, the host 20 sends a program command 10H to the I/O pins 1 to 8. In response to the command, the memory card outputs a low-level signal to the R/B pin to indicate that the memory card is busy. After a given period of time, the memory card outputs a high-level signal to the R/B pin to indicate that the memory card is ready.

It is to be noted that the states of the R/B pin shown in FIG. 18 represent the states viewed from the host 20 as to what state the memory card 1 lies in. In other words, even though the memory card indicates that the R/B pin is busy (outputs a low-level signal) in response to the program command 10H in FIG. 18, data is actually not always being written to the NAND flash memory 3 in the memory card (i.e., data is not always being transferred to a memory cell array from a page buffer). Even though the R/B pin returns to a ready state, data has actually not always been written to the NAND flash memory 3 in the memory card.

Figure 19:
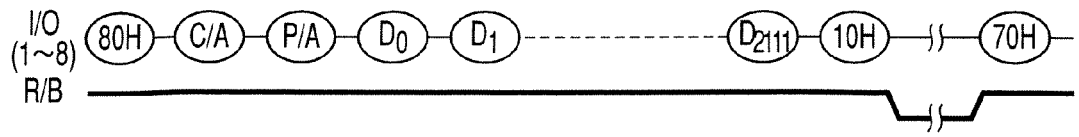
FIG. 19 is a timing chart of signals of I/O and R/B pins of a nonvolatile memory in the memory card according to the embodiment of the present invention, when a controller in the memory card writes data to the nonvolatile memory.

FIG. 19 is a timing chart of signals of I/O and R/B pins of the NAND flash memory 3 in the memory card 1 according to the embodiment of the present invention, when the controller 4 in the memory card 1 writes data to the NAND flash memory 3.

The controller 4 recognizes the NAND flash memory 3 to be a nonvolatile memory having an erase block size of 256 Kbytes. For example, when the controller 4 writes data to the NAND flash memory 3, the controller 4 sends a serial data input command 80H (H indicates a hexadecimal) to I/O pins 1 to 8. Then, the controller 4 sends a column address C/A and a page address P/A to the I/O pins 1 to 8. The column address C/A and page address P/A are a column address and a page address in virtual physical address space that the controller 4 assumes for the NAND flash memory 3. Hence, the column address C/A and page address P/A shown in FIG. 19 do not always correspond to those shown in FIG. 18.

The controller 4 also sends write data to each of the I/O pins 1 to 8 2112 times. More specifically, the controller 4 sequentially shifts in 2112-bit data to each of the I/O pins (2112 bytes in total for all the I/O pins) while clocking signals input to a write enable pin 2112 times. Completing the shift-in of data, the controller 4 sends a program command 10H to the I/O pins 1 to 8. In response to the command, the memory card outputs a low-level signal to the R/B pin to indicate that the memory card is busy. After a given period of time, the memory card outputs a high-level signal to the R/B pin to indicate that the memory card is ready.

It is to be noted that the states of the R/B pin shown in FIG. 19 represent the states viewed from the controller 4 as to what state the NAND flash memory 3 lies in.

FIGS. 18 and 19 illustrate each of the column address C/A and page address P/A in one cycle. However, there may be a case where two or more cycles are required in accordance with the capacity of the memory card 1 or the NAND flash memory 3.

Figure 20:
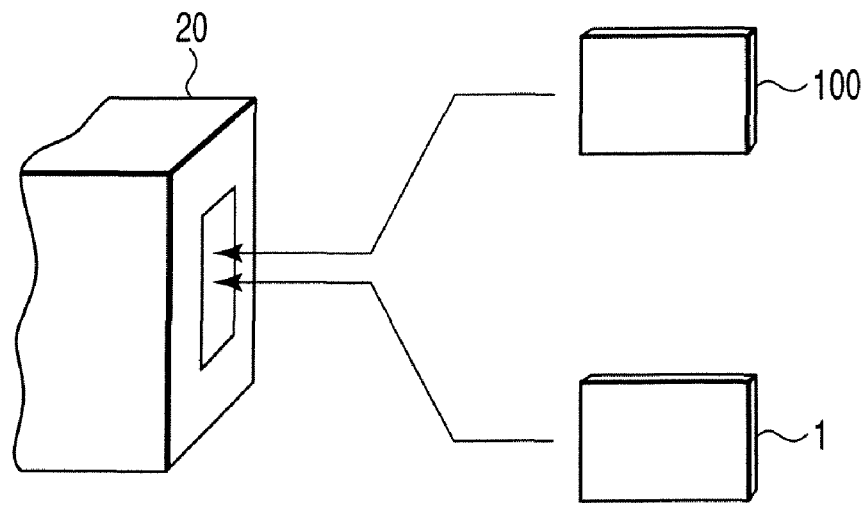
FIG. 20 is a schematic diagram showing a method of using the memory card according to the embodiment of the present invention.

FIG. 20 is a schematic diagram showing a method of using the memory card 1 according to the present embodiment.

Assume that a controller included in advance in the host 20 employs a small-block card 100 having an erase block unit of 16 Kbytes. If a large-block card is implemented using a memory having an erase block unit of 256 Kbytes without including an appropriate controller in the memory card, no correct access is likely to be executed because of a difference in erase unit. By implementing a large-block card including the controller 4 for a memory having an erase block unit of 256 Kbytes, it is possible to use a small-block card inserted into the host 20.

According to the foregoing embodiment of the present invention, the location of data can be optimized and the reduction in overhead costs in write mode can be achieved by acquiring sequential logical block addresses from information accompanied by a write command sent from the host that is to execute access to a small-block card and then locating data in order of the logical block address of the small-block card in the physical block of the large-block card. Moreover, the consistency between the small- and large-block cards can efficiently be maintained by managing a correspondence between the physical/logical block address of the small-block card and the physical block address of the large-block card. Furthermore, an erase command from the host is actually not reflected in part of the erase block size of the large-block card (the erase block is not partly set in erase state) but the CPU operates as if data were erased from the erase block in the memory card. A load on the internal operation of the large-block card can thus be reduced.

As has been described above in detail, according to the embodiment of the present invention, it is possible to provide a semiconductor device and a memory card capable of efficiently processing an access that assumes a memory having a different erase block size.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A memory system comprising:
a nonvolatile semiconductor memory which includes a plurality of blocks each having a plurality of pages, in which data is erasable in units of blocks, an erase block size of the nonvolatile semiconductor memory being larger than an erase block size of a memory assumed by a host device;
eight input/output terminals to input/output a command, an address, and data from/to an outside of the memory system; and
a ready/busy terminal to inform the outside of the memory system of an internal state of the memory system,
the memory system being configured to perform processing of:
in one write operation, capturing a first command, an address, and data, with 8-bit width via the eight input/output terminals,
managing a first table for converting a first physical address of the memory assumed by the host device into a first logical address of the memory assumed by the host device, and a second table for converting the first logical address into a second physical address of the nonvolatile semiconductor memory, the first table and the second table being provided in a RAM,
converting the first physical address into the second physical address using the first table and the second table when accessing the nonvolatile semiconductor memory, and
writing the data to the nonvolatile semiconductor memory while assuring that a plurality of data items, which are captured via the eight input/output terminals by a plurality of write operations, are stored in one page, and
the memory system being further configured to perform processing of:
upon receiving an erase command from the host device, notifying the host device that data corresponding to the erase command has been erased, while not actually erasing the data corresponding to the erase command.

2. The memory system according to claim 1, wherein the memory system captures another command and then outputs a busy signal from the ready/busy terminal, the busy signal indicating that the memory system is busy.

3. The memory system according to claim 2, wherein the captured command corresponds to 80H.

4. The memory system according to claim 2, wherein the captured another command corresponds to 10H.

5. The memory system according to claim 2, wherein the memory system writes the data together with an ECC code to the nonvolatile semiconductor memory, the ECC code being used to correct an error in the data.

6. The memory system according to claim 2, wherein the memory system reflects the first logical address and the first physical address corresponding to the data in the first table and the second table when the data is written to the nonvolatile semiconductor memory.

7. The memory system according to claim 2, wherein the memory system writes the data together with the first logical address corresponding to the data to the nonvolatile semiconductor memory.

8. The memory system according to claim 2, wherein the nonvolatile semiconductor memory is a NAND flash memory.

9. The memory system according to claim 2, wherein the memory system writes a plurality of data items to one block while assuring that logical addresses thereof are consecutive when logical addresses captured via the eight input/output terminals by the write operations are consecutive.

10. A memory system comprising:
a nonvolatile semiconductor memory which includes a plurality of blocks each having a plurality of pages, in which data is erasable in units of blocks, an erase block size of the nonvolatile semiconductor memory being larger than an erase block size of a memory assumed by a host device;
M input/output terminals (M is a natural number larger than 1) to input/output a command, an address, and data from/to an outside of the memory system; and
a ready/busy terminal to inform the outside of the memory system of an internal state of the memory system,
the memory system being configured to perform processing of:
in one write operation, capturing a command, an address, and data, with M-bit width via the M input/output terminals,
managing a first table for converting a first physical address of the memory assumed by the host device into a first logical address of the memory assumed by the host device, and a second table for converting the first logical address into a second physical address of the nonvolatile semiconductor memory, the first table and the second table being provided in a RAM,
converting the first physical address into the second physical address using the first table and the second table when accessing the nonvolatile semiconductor memory, and
writing the data to the nonvolatile semiconductor memory while assuring that a plurality of data items, which are captured via the M input/output terminals by a plurality of write operations, are stored in one page, and
the memory system being further configured to perform processing of:
upon receiving an erase command from the host device, notifying the host device that data corresponding to the erase command has been erased, while not actually erasing the data corresponding to the erase command.

11. The memory system according to claim 10, wherein the memory system captures another command and then outputs a busy signal from the ready/busy terminal, the busy signal indicating that the memory system is busy.

12. The memory system according to claim 11, wherein the captured command corresponds to 80H.

13. The memory system according to claim 11, wherein the captured another command corresponds to 10H.

14. The memory system according to claim 11, wherein the memory system writes the data together with an ECC code to the nonvolatile semiconductor memory, the ECC code being used to correct an error in the data.

15. The memory system according to claim 11, wherein the memory system reflects the first logical address and the first physical address corresponding to the data in the first table and the second table when the data is written to the nonvolatile semiconductor memory.

16. The memory system according to claim 11, wherein the memory system writes the data together with the first logical address corresponding to the data to the nonvolatile semiconductor memory.

17. The memory system according to claim 11, wherein the nonvolatile semiconductor memory is a NAND flash memory.

18. The memory system according to claim 11, wherein the memory system writes a plurality of data items to one block while assuring that logical addresses thereof are consecutive when logical addresses captured via the M input/output terminals by the write operations are consecutive.

19. A memory system comprising:
a nonvolatile semiconductor memory which includes a plurality of blocks each having a plurality of pages, in which data is erasable in units of blocks, an erase block size of the nonvolatile semiconductor memory being larger than an erase block size of a memory assumed by a host device;
M input/output terminals (M is a natural number larger than 1) to input/output a command, an address, and data from/to an outside of the memory system; and
a ready/busy terminal to inform the outside of the memory system of an internal state of the memory system,
the memory system being configured to perform processing of:
in one write operation, capturing a command, an address, and data, with M-bit width via the M input/output terminals,
managing a first table for converting a first physical address of the memory assumed by the host device into a first logical address of the memory assumed by the host device, and a second table for converting the first logical address into a second physical address of the nonvolatile semiconductor memory, the first table and the second table being provided in a RAM,
converting the first physical address into the second physical address using the first table and the second table when accessing the nonvolatile semiconductor memory, and
data size of one page of the nonvolatile semiconductor memory being two or more times as large as a maximum size of data that is captured by the one write operation of the memory system, and
the memory system being further configured to perform processing of:
upon receiving an erase command from the host device, notifying the host device that data corresponding to the erase command has been erased, while not actually erasing the data corresponding to the erase command.

20. The memory system according to claim 19, wherein the memory system captures another command and then outputs a busy signal from the ready/busy terminal, the busy signal indicating that the memory system is busy.

21. The memory system according to claim 20, wherein the captured command corresponds to 80H.

22. The memory system according to claim 20, wherein the captured another command corresponds to 10H.

23. The memory system according to claim 20, wherein the memory system writes the data together with an ECC code to the nonvolatile semiconductor memory, the ECC code being used to correct an error in the data.

24. The memory system according to claim 20, wherein the memory system reflects the first logical address and the first physical address corresponding to the data in the first table and the second table when the data is written to the nonvolatile semiconductor memory.

25. The memory system according to claim 20, wherein the memory system writes the data together with the first logical address corresponding to the data to the nonvolatile semiconductor memory.

26. The memory system according to claim 20, wherein the nonvolatile semiconductor memory is a NAND flash memory.

27. The memory system according to claim 20, wherein the memory system writes a plurality of data items to one block while assuring that logical addresses thereof are consecutive when logical addresses captured via the M input/output terminals by the write operations are consecutive.

* * * * *